(12) United States Patent
Nakamura et al.

(10) Patent No.: US 10,356,502 B2
(45) Date of Patent: Jul. 16, 2019

(54) ELECTRONIC DEVICE

(71) Applicant: KYOCERA CORPORATION, Kyoto (JP)

(72) Inventors: Kotaro Nakamura, Daito (JP); Kouta Iyoda, Neyagawa (JP)

(73) Assignee: KYOCERA CORPORATION, Kyoto (JP)

(*) Notice: Subject to any disclaimer, the term of this patent is extended or adjusted under 35 U.S.C. 154(b) by 0 days.

(21) Appl. No.: 15/436,366

(22) Filed: Feb. 17, 2017

(65) Prior Publication Data
US 2017/0251291 A1    Aug. 31, 2017

(30) Foreign Application Priority Data
Feb. 25, 2016 (JP) .................. 2016-033848

(51) Int. Cl.
*H04R 1/02* (2006.01)
*H04R 9/08* (2006.01)
*H04R 1/08* (2006.01)
*H05K 5/02* (2006.01)
*H05K 7/14* (2006.01)
*H04R 31/00* (2006.01)

(52) U.S. Cl.
CPC .......... *H04R 1/083* (2013.01); *H04R 31/006* (2013.01); *H05K 5/0217* (2013.01); *H05K 7/14* (2013.01); *H04R 2499/11* (2013.01); *H04R 2499/15* (2013.01)

(58) Field of Classification Search
CPC .... H04R 1/2892; H04R 2499/11; H04R 9/08; H05K 3/301

USPC .......... 381/122, 91, 355, 361, 369, 374–375
See application file for complete search history.

(56) References Cited

U.S. PATENT DOCUMENTS

| 5,154,381 A * | 10/1992 | Malinao ................. F16M 11/10 248/121 |
| 6,441,292 B1 * | 8/2002 | Donnell ................... G10H 3/12 84/723 |
| 2006/0091595 A1 * | 5/2006 | Hayashi ............. B60G 21/0551 267/276 |
| 2006/0128444 A1 | 6/2006 | Toki |
| 2012/0257779 A1 * | 10/2012 | Kimura .................. H04N 5/225 381/359 |
| 2014/0254849 A1 * | 9/2014 | Abe ........................ H04R 1/086 381/334 |

FOREIGN PATENT DOCUMENTS

| JP | 2006-173718 | 6/2006 |
| JP | 2006333076 A | 12/2006 |
| JP | 2009152926 A | 7/2009 |
| JP | 2011147103 A | 7/2011 |
| JP | 2013179437 A | 9/2013 |

* cited by examiner

*Primary Examiner* — George C Monikang
(74) *Attorney, Agent, or Firm* — Duane Morris LLP

(57) ABSTRACT

An electronic device includes a housing, an elastic member positioned by the housing, and an acoustic component held by the elastic member. The elastic member includes a main body portion surrounding the acoustic component and a membrane portion which is continuous to the main body portion and faces the acoustic component. The housing includes a passage which communicates the membrane portion and an external space with each other.

12 Claims, 7 Drawing Sheets

ELECTRONIC DEVICE

The present application claims priority under 35 U.S.C. § 119 to Japanese Patent Application No. 2016-033848 filed on Feb. 25, 2016, entitled "Electronic Device." The content of which is incorporated by reference herein in its entirety.

FIELD

The present disclosure relates to an electronic device.

BACKGROUND

An electronic device structured to hold a microphone in a microphone holder made of an elastic body has been known.

SUMMARY

An electronic device based on the present disclosure includes a housing, an elastic member positioned by the housing, and an acoustic component held by the elastic member. The elastic member includes a main body portion surrounding the acoustic component and a membrane portion which is continuous to the main body portion and faces the acoustic component. The housing includes a passage which communicates the membrane portion and an external space with each other.

The foregoing and other objects, features, aspects and advantages of the present disclosure will become more apparent from the following detailed description of the present disclosure when taken in conjunction with the accompanying drawings.

DETAILED DESCRIPTION

Figure 1:
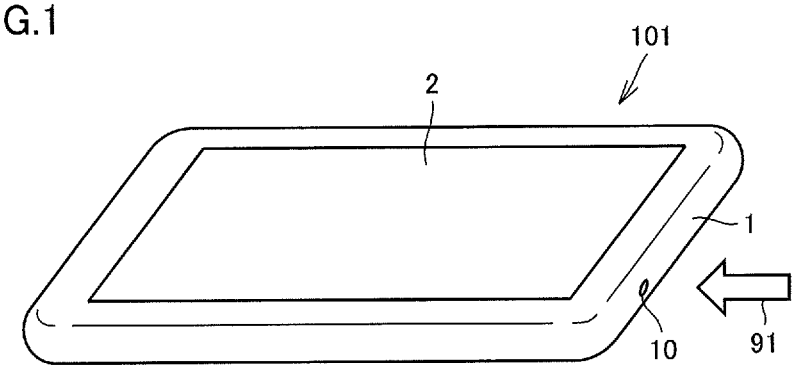
FIG. 1 is a perspective view of an electronic device in a first embodiment based on the present disclosure.

A dimensional ratio shown in the drawings does not necessarily faithfully represent an actual dimensional ratio and a dimensional ratio may be exaggerated for the sake of convenience of description. A concept up or upper or down or lower mentioned in the description below does not mean absolute up or upper or down or lower but may mean relative up or upper or down or lower in terms of a shown position.

(First Embodiment)

An electronic device in a first embodiment based on the present disclosure will be described with reference to FIGS. 1 to 7. FIG. 1 shows appearance of the electronic device in the present embodiment. Though description of the electronic device is given here with a smartphone being defined as the electronic device by way of example, a type of the electronic device is not limited to the smartphone.

Figure 2:
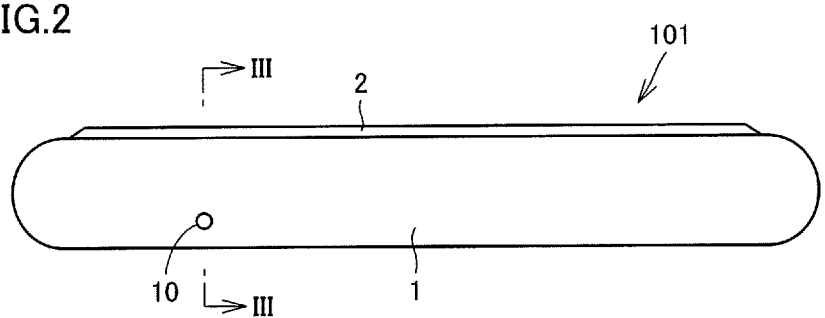
FIG. 2 is a side view of the electronic device in the first embodiment based on the present disclosure.
Figure 3:
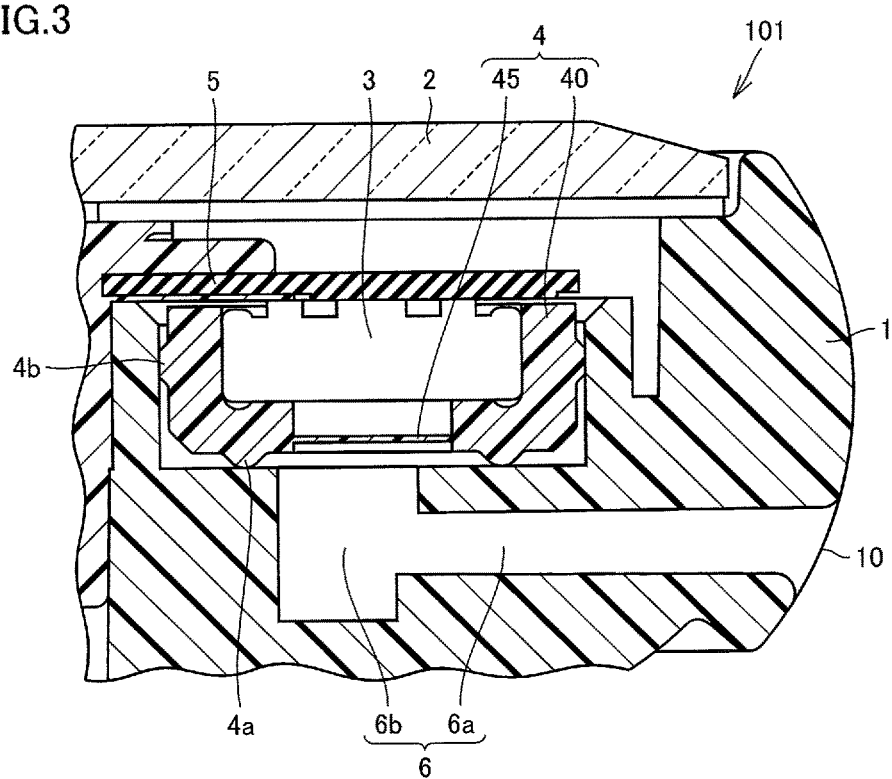
FIG. 3 is a cross-sectional view along the line III-III in FIG. 2.

An electronic device 101 may include a display. A cover glass 2 is located to cover the display. A touch panel may be located on cover glass 2. Electronic device 101 includes a housing 1. A hole 10 is located in housing 1. Electronic device 101 may include a button for a user to operate. FIG. 2 shows a view of electronic device 101 from a side shown with an arrow 91 in FIG. 1. FIG. 3 shows a cross-sectional view along the line III-III in FIG. 2.

Figure 4:
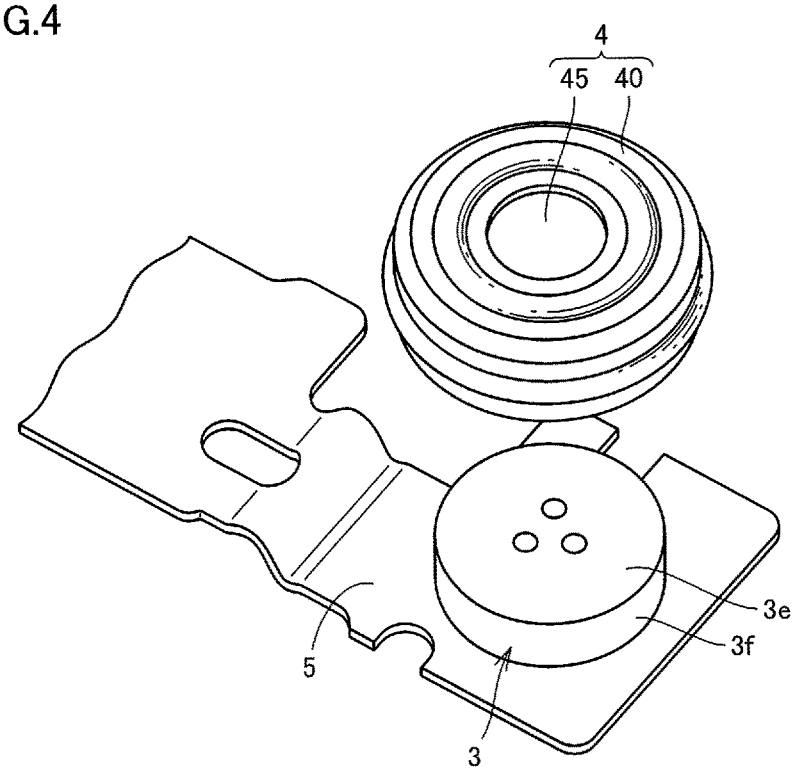
FIG. 4 is an exploded view of an elastic member and the like included in the electronic device in the first embodiment based on the present disclosure.
Figure 5:
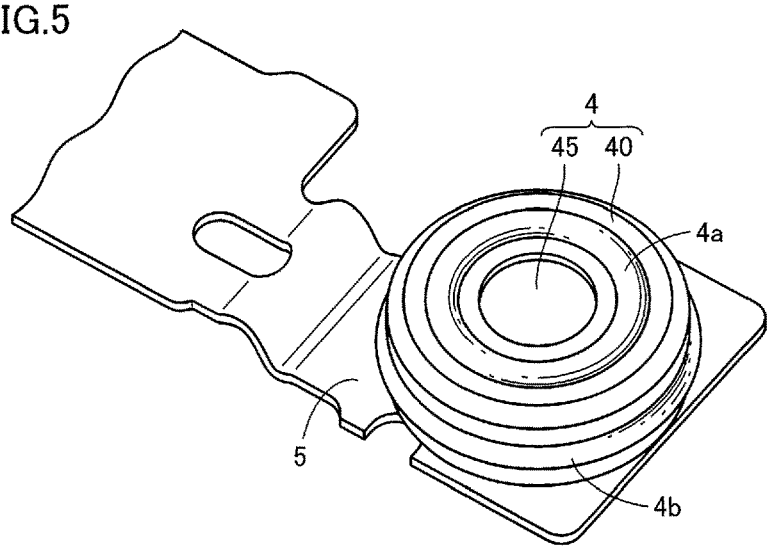
FIG. 5 is a perspective view of an acoustic component included in the electronic device in the first embodiment based on the present disclosure, as being covered with the elastic member.
Figure 6:
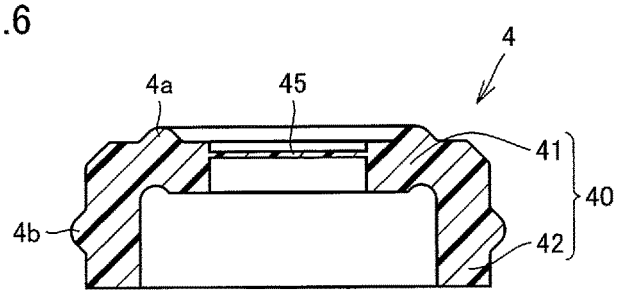
FIG. 6 is a cross-sectional view of the elastic member included in the electronic device in the first embodiment based on the present disclosure.
Figure 7:
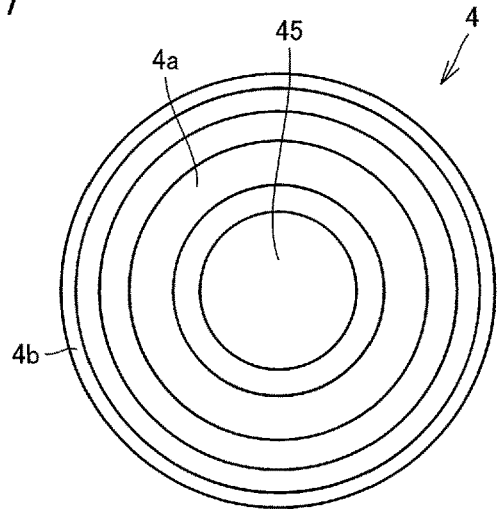
FIG. 7 is a plan view of the elastic member included in the electronic device in the first embodiment based on the present disclosure.

As shown in FIG. 3, electronic device 101 includes housing 1, an elastic member 4 positioned by housing 1, and an acoustic component 3 held by elastic member 4. For example, a microphone may be employed as acoustic component 3. Acoustic component 3 may be mounted on a substrate 5. Acoustic component 3 may be supplied as an integrated component as being mounted on substrate 5. Substrate 5 may be a wiring board with a flexible portion. For better understanding of relation among elastic member 4, acoustic component 3, and substrate 5, FIG. 4 shows an exploded view with attention being paid to these components. Acoustic component 3 is located on substrate 5 also in FIG. 4. FIG. 5 shows acoustic component 3 covered with elastic member 4. Elastic member 4 includes a main body portion 40 surrounding acoustic component 3 and a membrane portion 45 which is continuous to main body portion 40 and faces acoustic component 3. FIG. 6 shows a cross-sectional view of elastic member 4 extracted alone. Membrane portion 45 is formed of a material the same as that for main body portion 40. Membrane portion 45 may be formed integrally with main body portion 40. Membrane portion 45 is in a form of a thin membrane, and it does not allow passage of water but allows passage of sound. FIG. 7 shows a plan view of elastic member 4.

As shown in FIG. 3, housing 1 includes a passage 6 which communicates membrane portion 45 and an external space with each other. Passage 6 may include a first passage portion 6a extending in a direction in which the inside of hole 10 can be seen and a second passage portion 6b extending in a direction perpendicular to membrane portion 45. A shape of passage 6 shown here is merely by way of example and limitation thereto is not intended.

Since elastic member 4 holding acoustic component 3 includes membrane portion 45 in the present embodiment, it is not necessary to locate another component constructed to hold a vibrating membrane between elastic member 4 and housing 1. Therefore, in the present embodiment, a thickness of the entire electronic device can be reduced while the electronic device is waterproof.

Since elastic member 4 itself which holds acoustic component 3 includes membrane portion 45 which can serve as a vibrating membrane in the present embodiment, the number of parts can be reduced while waterproofness of electronic device 101 is ensured.

As shown in FIG. 4 in the present embodiment, acoustic component 3 may include a circular surface 3*e* and a cylindrical outer surface 3*f* extending from an outer circumference of circular surface 3*e* perpendicularly to circular surface 3*e*. As shown in FIG. 6, main body portion 40 of elastic member 4 may include a first portion 41 located along circular surface 3*e* and surrounding membrane portion 45 and a second portion 42 located along cylindrical outer surface 3*f*. When elastic member 4 is in such a shape as wrapping acoustic component 3, elastic member 4 can hold acoustic component 3 in a stable manner.

As shown in FIGS. 6 and 7, elastic member 4 may include a protrusion portion 4*a* in first portion 41. As shown in the present embodiment, first portion 41 may include a protrusion portion 4*a* protruding away from circular surface 3*e*. With first portion 41 of elastic member 4 including such protrusion portion 4*a*, protrusion portion 4*a* tends to deform by being compressed when elastic member 4 is pressed against housing 1, and hence the elastic member can be in intimate contact with housing 1. As shown in FIG. 7, protrusion portion 4*a* may be annular. With protrusion portion 4*a* being annular, an annular intimate contact region can be located at a portion where housing 1 and elastic member 4 abut on each other when elastic member 4 is pressed against housing 1, and hence a probability of entry of water through a gap between housing 1 and elastic member 4 can be lowered.

As shown in FIGS. 6 and 7, elastic member 4 may include a protrusion portion 4*b* in second portion 42. Protrusion portion 4*b* is located along an outer circumferential surface of second portion 42. Protrusion portion 4*b* is located to protrude radially outward. Protrusion portion 4*b* is continuously located to surround an outer circumference of second portion 42.

Elastic member 4 may be composed mainly of silicone rubber. With this composition, elastic member 4 can be highly elastic.

Membrane portion 45 includes a portion having a thickness not smaller than 0.08 mm and not greater than 0.1 mm. With at least a part of membrane portion 45 having such a thickness, membrane portion 45 can satisfactorily function as a vibrating membrane.

(Second Embodiment)

Figure 8:
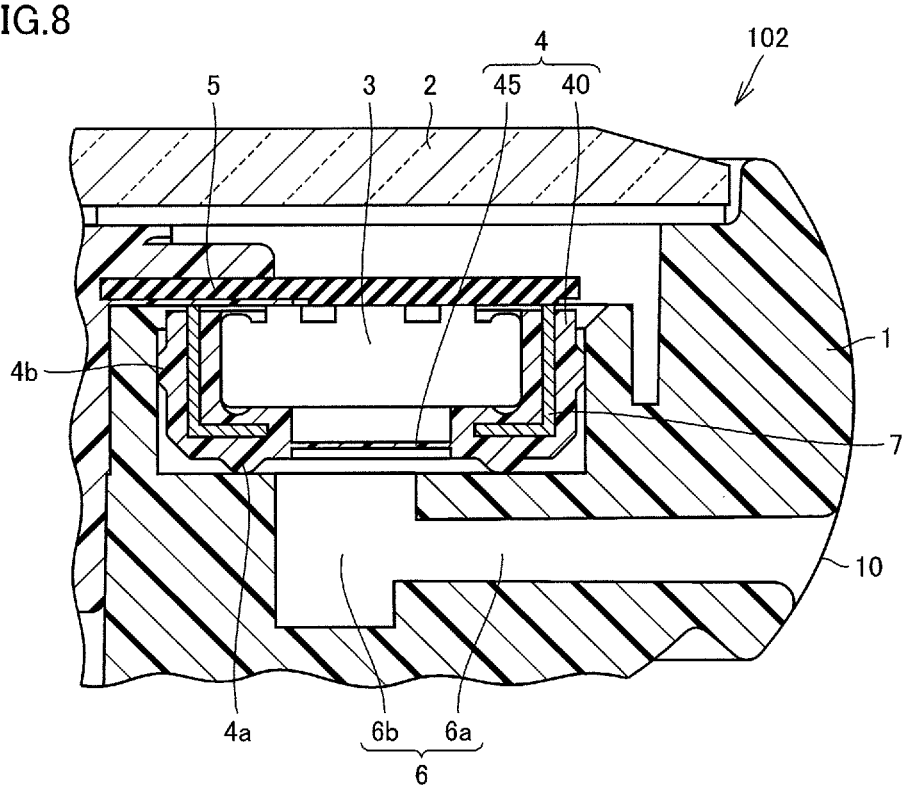
FIG. 8 is a partial cross-sectional view of an electronic device in a second embodiment based on the present disclosure.
Figure 9:
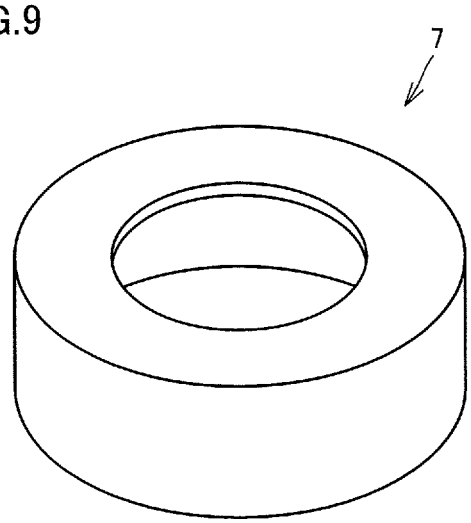
FIG. 9 is a perspective view of a rigid member included in the electronic device in the second embodiment based on the present disclosure.

An electronic device in a second embodiment based on the present disclosure will be described with reference to FIGS. 8 to 9. FIG. 8 shows a partial cross-sectional view of the electronic device in the present embodiment. FIG. 8 is a cross-sectional view of an electronic device 102 in the present embodiment, at a portion the same as in FIG. 3 in the first embodiment. Though electronic device 102 in the present embodiment is common in basic construction to electronic device 101 shown in the first embodiment, it is different on the following points.

In electronic device 102, elastic member 4 contains a rigid member 7. FIG. 9 shows rigid member 7 extracted alone. FIG. 9 shows one example of a shape of rigid member 7. A shape other than the shape shown here can also be adopted as a shape of rigid member 7.

Two-color molding can be adopted for fabrication of elastic member 4. Elastic member 4 can be fabricated, for example, with a method of preparing a mold corresponding to an outer shape of elastic member 4, locating separately fabricated rigid member 7 as a core in the mold, and injecting an elastic material in a cavity in the mold. Rigid member 7 is not necessarily entirely wrapped in the elastic material in elastic member 4. A part of rigid member 7 may be exposed to the outside of elastic member 4.

Since elastic member 4 contains rigid member 7 in the present embodiment, vibration of elastic member 4 can be stabilized. Rigid member 7 is located in main body portion 40 of elastic member 4. Thus, when membrane portion 45 of elastic member 4 vibrates, a degree of occurrence of undesired vibration in main body portion 40 due to transmission of this vibration to main body portion 40 can be lowered. Therefore, elastic member 4 can be structured such that a portion to vibrate vibrates and a portion which should not vibrate is less likely to vibrate and vibration is thus stabilized.

Rigid member 7 may be formed from a metal member. A metal member herein may be composed, for example, of stainless steel. Rigid member 7 may be obtained by plastic deformation such as bending of a plate material made of stainless steel. With rigid member 7 being formed from a metal member, workability is high and high rigidity can be obtained.

As exemplified in the present embodiment, rigid member 7 may include a flat portion with an opening and a cylindrical portion extending like a cylinder from an outer circumference of the flat portion. With such rigid member 7, rigidity of elastic member 4 can efficiently be enhanced and consequently, undesired vibration which may occur in elastic member 4 can effectively be reduced. An outer shape of the flat portion may be circular in rigid member 7. The opening in the flat portion may be circular. The opening in the flat portion may be concentric with the outer circumference of the flat portion.

Figure 10:
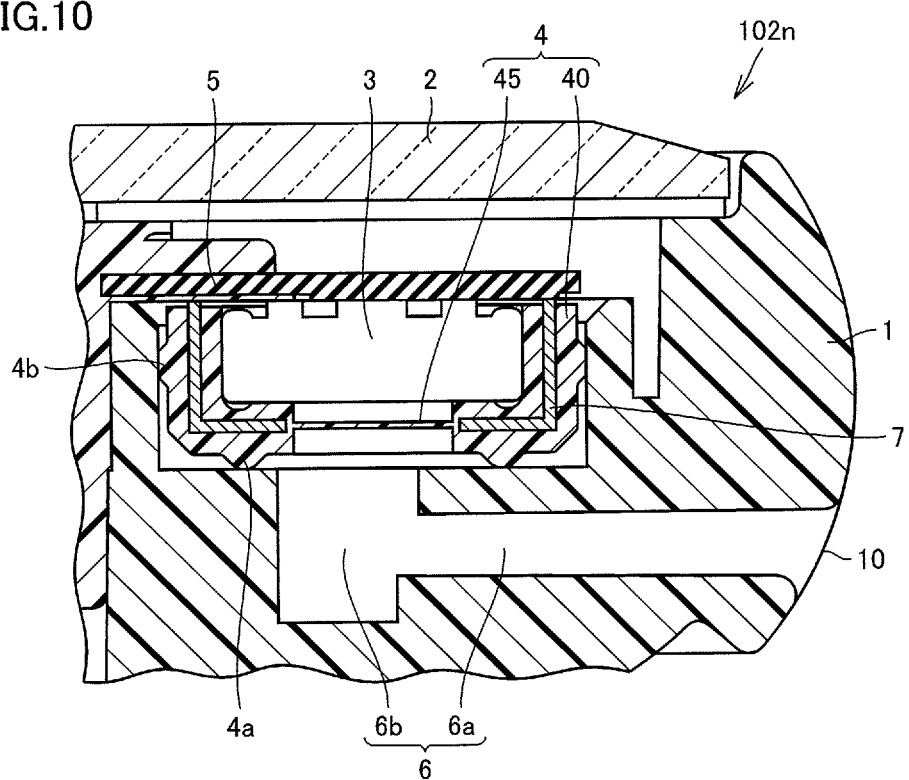
FIG. 10 is a partial cross-sectional view of a modification of the electronic device in the second embodiment based on the present disclosure.

An electronic device 102*n* structured as shown in FIG. 10 represents a modification of the present embodiment. In electronic device 102*n*, membrane portion 45 and the flat portion are located in the same plane. With this construction, a degree of transmission of vibration from membrane portion 45 to elastic member 4 can effectively be lowered. In the example shown in FIG. 10, an opening is located in the center of the flat portion and an inner circumference of the opening is in proximity to an outer circumference of membrane portion 45. With the inner circumference of the flat portion being brought in proximity to the outer circumference of membrane portion 45 as much as possible, a degree of transmission of vibration from membrane portion 45 to elastic member 4 can effectively be lowered.

(Third Embodiment)

Figure 11:
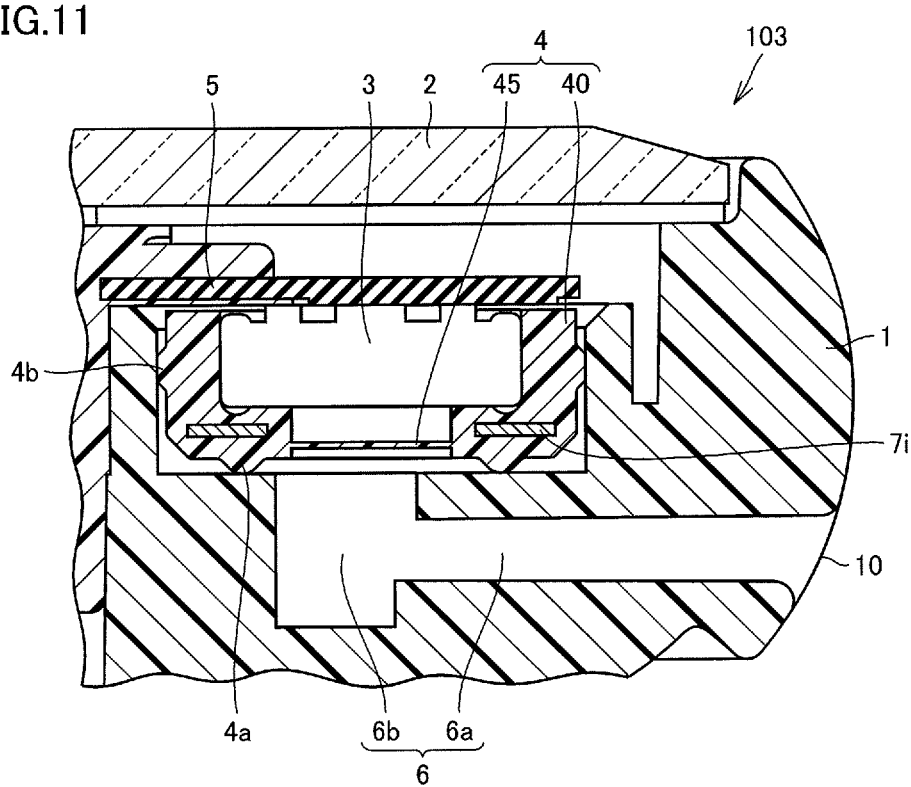
FIG. 11 is a partial cross-sectional view of an electronic device in a third embodiment based on the present disclosure.
Figure 12:
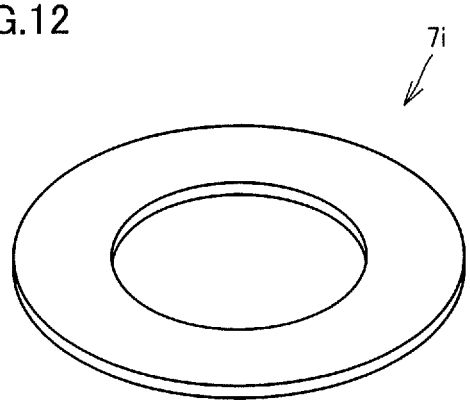
FIG. 12 is a perspective view of a rigid member included in the electronic device in the third embodiment based on the present disclosure.

An electronic device in a third embodiment based on the present disclosure will be described with reference to FIGS. 11 to 12. FIG. 11 shows a cross-sectional view of the electronic device in the present embodiment. FIG. 11 is a cross-sectional view of an electronic device 103 in the present embodiment, at a portion the same as in FIG. 3 in the first embodiment. Though electronic device 103 in the present embodiment is common in basic construction to electronic device 102 shown in the second embodiment, it is different on the following points.

In electronic device 103, elastic member 4 contains a rigid member 7*i*. FIG. 12 shows rigid member 7*i* extracted alone.

Rigid member 7i may be a disc with an opening in the center. In this case as well, rigid member 7i can be defined as including a flat portion.

An effect the same as in the second embodiment can be obtained also in the present embodiment. The present embodiment may be different from the second embodiment in extent of the effect of stabilization of vibration in elastic member 4. Since rigid member 7i is simpler in structure than rigid member 7, fabrication of rigid member is facilitated.

Explanation of a material for rigid member 7 in the second embodiment is also applicable to a material for rigid member 7i.

Figure 13:
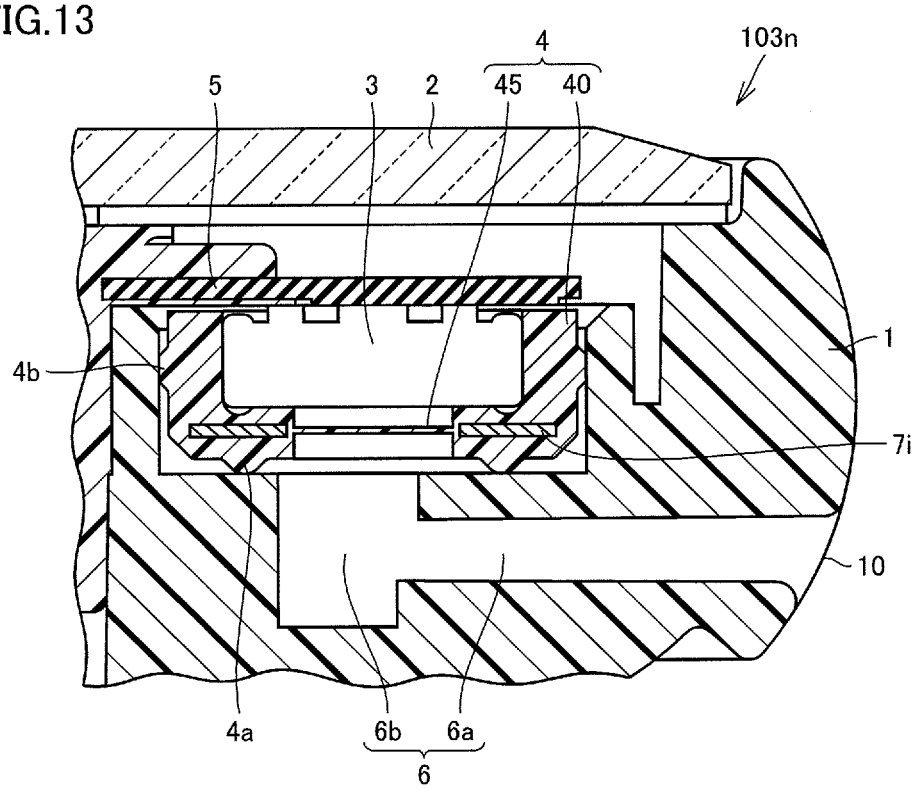
FIG. 13 is a partial cross-sectional view of a modification of the electronic device in the third embodiment based on the present disclosure.

An electronic device 103n structured as shown in FIG. 13 represents a modification of the present embodiment. In electronic device 103n, membrane portion 45 and the flat portion of rigid member 7i are located in the same plane. With this construction, a degree of transmission of vibration from membrane portion 45 to elastic member 4 can effectively be lowered. As shown in FIG. 13, the inner circumference of the flat portion is brought in proximity to the outer circumference of membrane portion 45 as much as possible, so that a degree of transmission of vibration from membrane portion 45 to elastic member 4 can effectively be lowered.

Though a microphone has been shown as an example of the acoustic component in each embodiment above, a component other than the microphone may be employed as the acoustic component. The acoustic component should only be a component which can provide at least any one of input and output of voice and sound. For example, a speaker may be employed as the acoustic component.

Some features in embodiments above may be adopted as being combined as appropriate.

Though description has been given so far by using the term "electronic device," the electronic device is a broad concept covering, for example, a portable telephone, a portable information terminal, a tablet terminal, a personal computer, a game console, a television receiver, a portable music player, a CD player, a DVD player, an electronic calculator, an electronic organizer, an electronic dictionary, an electronic book reader, a digital camera, a video camera, a radio receiver, a navigation system, and a measurement instrument. The concept of the portable telephone or the portable information terminal includes a smartphone.

Though embodiments of the present disclosure have been described, it should be understood that the embodiments disclosed herein are illustrative and non-restrictive in every respect. The scope of the present disclosure is defined by the terms of the claims and is intended to include any modifications within the scope and meaning equivalent to the terms of the claims.

The invention claimed is:

1. An electronic device comprising:
a housing of the electronic device;
an elastic member contained within the housing; and
an acoustic component held by the elastic member,
the elastic member including a main body portion surrounding the acoustic component and a membrane portion which is continuous to the main body portion and faces the acoustic component,
the housing including a passage which communicates the membrane portion and an external space with each other, wherein the elastic member encases a rigid member such that at least a portion of the elastic member is arranged in at least a portion of a space between the rigid member and the acoustic component and that the rigid member surrounds at least a portion of the acoustic component, and wherein the rigid member is more rigid than the elastic member, the rigid member comprising a flat portion with an opening and a cylindrical portion extending from an outer circumference of the flat portion, wherein the cylindrical portion is perpendicular to the flat portion and surrounds the acoustic component.

2. The electronic device according to claim 1, wherein the rigid member is a metal member.

3. The electronic device according to claim 1, wherein the rigid member includes a flat portion including an opening and a cylindrical portion extending like a cylinder from an outer circumference of the flat portion.

4. The electronic device according to claim 3, wherein the membrane portion and the flat portion are located in an identical plane.

5. The electronic device according to claim 1, wherein the acoustic component includes a circular surface and a cylindrical outer surface extending perpendicularly to the circular surface from an outer circumference of the circular surface, and
the main body portion includes a first portion located along the circular surface and surrounding the membrane portion and a second portion located along the cylindrical outer surface.

6. The electronic device according to claim 5, wherein the first portion includes a protrusion portion protruding away from the circular surface.

7. The electronic device according to claim 6, wherein the protrusion portion is annular.

8. The electronic device according to claim 1, wherein the elastic member is mainly composed of silicone rubber.

9. The electronic device according to claim 1, wherein the membrane portion includes a portion having a thickness not smaller than 0.08 mm and not greater than 0.1 mm.

10. The electronic device according to claim 1, wherein an outer shape of the flat portion is circular and the opening is circular such that the flat portion has a shape of a flat ring.

11. The electronic device according to claim 1, wherein an inner circumference of the flat ring, which defines the opening, is adjacent to and concentric with an outer circumference of the membrane portion.

12. The electronic device according to claim 1, wherein the membrane portion and the flat portion are coplanar with each other.

* * * * *